(12) United States Patent
Sakaguchi

(10) Patent No.: US 6,647,138 B1
(45) Date of Patent: Nov. 11, 2003

(54) ELECTRONIC COMPONENT MOUNTING METHOD AND MOUNTING APPARATUS

(75) Inventor: Hiroyuki Sakaguchi, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/541,104

(22) Filed: Mar. 31, 2000

(30) Foreign Application Priority Data

Apr. 2, 1999 (JP) .......................................... 11-096341

(51) Int. Cl.[7] .................................................. G06F 9/00
(52) U.S. Cl. .................................. 382/151; 250/559.29
(58) Field of Search .............................. 382/151, 146, 382/148, 294, 286, 287; 250/559.29, 559.3; 356/398; 358/504; 348/95

(56) References Cited

U.S. PATENT DOCUMENTS

| | | | | |
|---|---|---|---|---|
| 5,113,788 A | * | 5/1992 | Izumi et al. ................. | 118/663 |
| 5,237,622 A | * | 8/1993 | Howell ........................ | 382/151 |
| 5,903,662 A | * | 5/1999 | DeCarlo ....................... | 382/151 |
| 6,070,783 A | * | 6/2000 | Nakazato .................... | 228/105 |
| 6,195,454 B1 | * | 2/2001 | Yazawa ....................... | 382/151 |
| 6,219,442 B1 | * | 4/2001 | Harper et al. ............... | 382/141 |
| 6,246,789 B1 | * | 6/2001 | Hosotani et al. ............ | 382/151 |
| 6,249,336 B1 | * | 6/2001 | Ota .............................. | 355/53 |
| 6,272,018 B1 | * | 8/2001 | Feld et al. ................... | 361/760 |

* cited by examiner

*Primary Examiner*—Daniel G. Mariam
*Assistant Examiner*—Shefali Patel
(74) *Attorney, Agent, or Firm*—RatnerPrestia

(57) ABSTRACT

The substrate recognition time is shortened, and the productivity is enhanced. This is an electronic component mounting method for mounting a plurality of electronic components on a substrate by using a plurality of moving tables. Each moving table of the plurality of moving tables has a mounting head for picking up and transferring each electronic component, and a camera for recognizing the substrate. The mounting method includes the steps of (a) taking a calibration substrate having a reference mark for position calibration by the camera, and obtaining a position calibration data intrinsic to each moving table having the camera, (b) taking the substrate by only one of the cameras prior to mounting of each electronic component, and recognizing the position of the substrate, and (c) picking up each electronic component by each mounting head, and mounting the electronic component on the substrate. The step of mounting each electronic component on the substrate includes a step of controlling the position of the moving table on the basis of the substrate position recognition result and the position calibration data.

13 Claims, 4 Drawing Sheets

ELECTRONIC COMPONENT MOUNTING METHOD AND MOUNTING APPARATUS

TECHNICAL FIELD OF THE INVENTION

The present invention relates to an electronic component mounting method of mounting electronic components on a substrate, and an electronic component mounting apparatus.

BACKGROUND OF THE INVENTION

An electronic component mounting apparatus comprises a moving table for moving a mounting head which picks up an electronic component from an electronic component feeder onto an object substrate. As such moving table, an orthogonal coordinate system table for making linear motions in the X, Y, Z directions is widely employed. This moving table generally comprises a substrate recognition camera which moves together with the mounting head. By taking the substrate by this camera, the position of the substrate is detected, and the position is adjusted when mounting the electronic component on the basis of the result of position detection.

Other conventional electronic component mounting apparatus comprises a plurality of moving tables for the purpose of enhancing the mounting efficiency, and by using a plurality of mounting heads for one substrate, electronic components are mounted simultaneously by parallel operation. In such conventional mounting apparatus, each one of the plurality of moving tables has a substrate recognition camera. Prior to mounting of electronic components, the object substrate is recognized by a plurality of cameras of the plurality of moving tables.

In such conventional method, however, one substrate must be recognized plural times, and the time of moving the camera to the recognition point on the substrate is duplicated. As a result, the cycle time of the entire mounting process is longer, and the productivity is lowered:

It is hence an object of the invention to present an electronic component mounting method capable of shortening the cycle time and enhancing the productivity.

SUMMARY OF THE INVENTION

The electronic component mounting method of the invention is a method of mounting a plurality of electronic components on a substrate by using a plurality of moving tables. Each moving table of the plurality of moving tables has a mounting head for picking up and transferring each electronic component, and a camera for recognizing the substrate. The mounting method comprises:

(a) a step of taking a substrate for calibration having a reference mark for position calibration by the camera, and obtaining position calibration data intrinsic to each moving table having the camera, (b) a step of taking the substrate by only one of the cameras prior to mounting of each electronic component, and recognizing the position of the substrate, and (c) a step of picking up each electronic component by each mounting head, and mounting the electronic component on the substrate.

The step of mounting each electronic component on the substrate includes a step of controlling the position of the moving table on the basis of the substrate position recognition result and the position calibration data.

The electronic component mounting apparatus of the invention comprises:

(a) a base, (b) a first moving table and a second moving table installed on the base, in which the first moving table and second moving table are movable on the base, the first moving table has a first mounting head and a first camera, the second moving table has a second mounting head and a second camera, and the first mounting head and second mounting head have a function of picking up and transferring a plurality of electronic components, (c) position calibration data acquiring means for recognizing the position of the first moving table and second moving table, and calibrating the position of the first moving table and second moving table, (d) position recognizing means for recognizing the position of the substrate mounted on the base, in which the position recognizing means is recognized when taken by the first camera only, (e) controlling means for controlling the position of the first moving table and second moving table on the basis of the position recognizing means and position calibration data acquiring means, and (f) driving means for driving the first moving table, second moving table, first mounting head and second mounting head.

In this configuration, the cycle time is shortened. As a result, the productivity is enhanced.

REFERENCE NUMERALS

Figure 1:
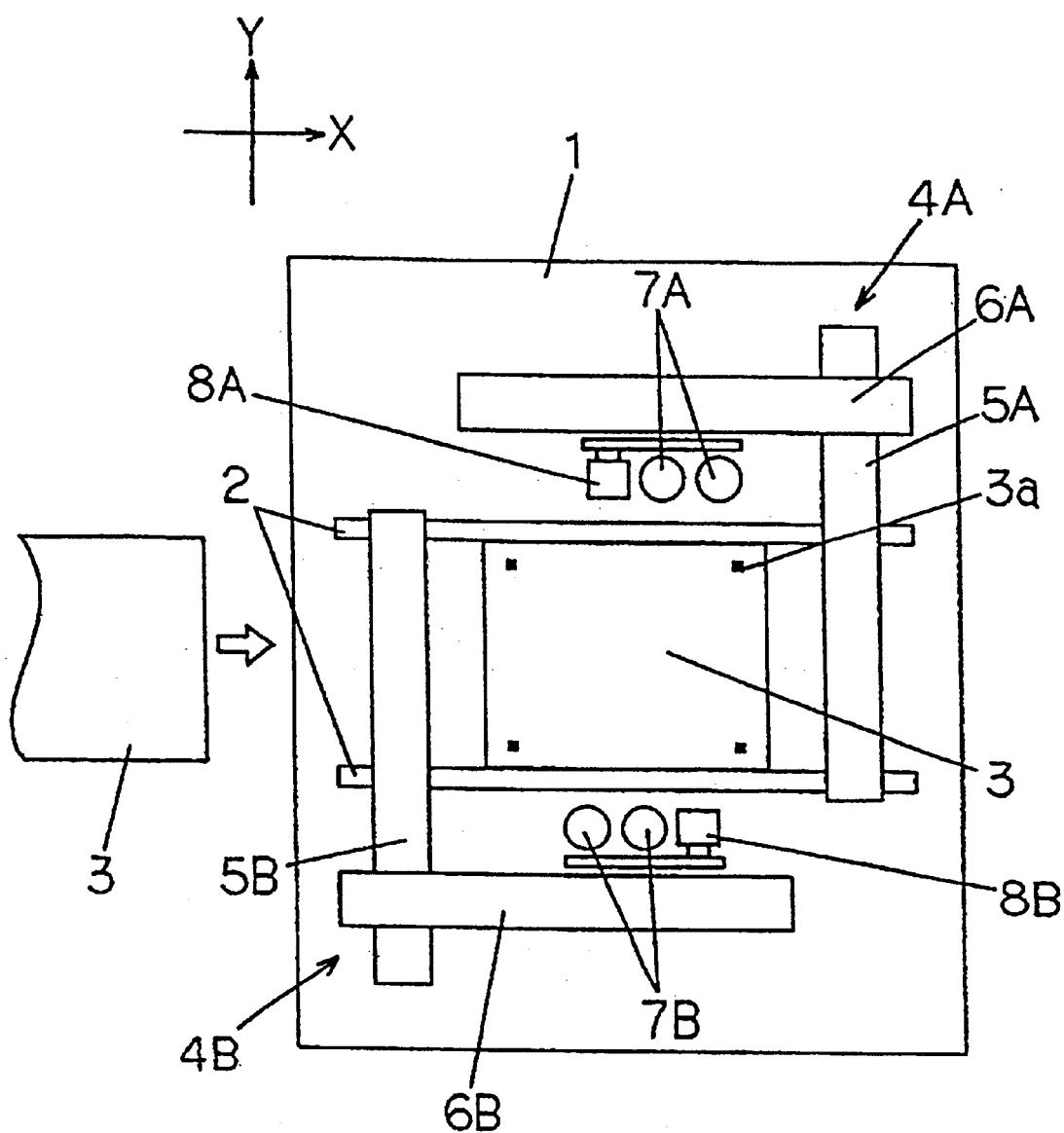
FIG. 1 is a plan view of an electronic component mounting apparatus in an embodiment of the invention.

1 Base
2 Conveying path
3 Substrate
3*a* Recognition mark
3*b* Reference mark
3*e* Calibration substrate (position calibration substrate)
4A First moving table
4B Second moving table
5A First Y-table
5B Second Y-table
6A First X-table
6B Second X-table
7A First mounting head
7B Second mounting head
8A First camera
8B Second camera
9M Reference position recognition mark
11 Position calibration data acquisition unit
12 Substrate position recognition unit
13 Control unit
14 Drive control unit

DETAILED DESCRIPTION OF THE INVENTION

An electronic component mounting method in an embodiment of the invention is a method of mounting electronic components on a single substrate by using a plurality of moving tables. Each moving table of the plurality of moving tables has a mounting head for picking up and transferring electronic component, and a camera for recognizing the substrate on which the electronic component is mounted.

The mounting method comprises a step of taking a substrate for calibration having a reference mark for position calibration by the camera, and obtaining position calibration data intrinsic to the moving table having the camera, a step of taking the substrate by any one of the cameras prior to mounting of electronic components, and recognizing the position of the substrate, and a step of picking up each electronic component by each mounting head of the plurality of moving tables, and mounting on the substrate.

This mounting step includes a step of controlling the position of the moving table on the basis of the substrate position recognition result and the position calibration data intrinsic to the moving table.

An electronic component mounting method in other embodiment of the invention comprises:

(a) a step of preparing a base, and a first moving table and a second moving table installed on the base, in which the first moving table and second moving table are movable on the base, the first moving table has a first mounting head and a first camera, the second moving table has a second mounting head and a second camera, and the first mounting head and second mounting head pick up and transfer a plurality of electronic components, (b) a step of acquiring position calibration data intrinsic to each moving table of the first moving table and second moving table, (c) a step of conveying a substrate onto the base, (d) a step of recognizing the position of the substrate by at least one camera of the first camera and second camera, and acquiring the position recognition data, (e) a step of controlling the position of the first moving table and second moving table on the basis of the position calibration data and position recognition data, and (f) a step of picking up the plurality of electronic components by the first mounting head and second mounting head, and mounting on the substrate.

Preferably, the following calibration is provided.

The step of acquiring the position recognition data is a step of recognizing the position of the substrate by only one camera of the first camera and second camera.

The step of acquiring the position calibration data includes:

(1) a step of mounting a substrate for calibration having a reference mark on the base, and (2) a step of taking the reference mark by at least one camera of the first camera and second camera, and acquiring the position calibration data for calibrating the position deviation.

The reference mark has a plurality of reference marks, and the step of acquiring the position calibration data includes a step of taking all of the plurality of reference marks by the first camera, and recognizing the position deviation of each reference mark of the plurality of reference marks.

The step of acquiring the position recognition data includes a step of moving the first moving table, and recognizing the position of the recognition mark set on the substrate by the first camera.

The recognition mark has a plurality of recognition marks, and the first camera recognizes each recognition mark of the plurality of recognition marks sequentially.

The step of acquiring the position recognition data includes a step of acquiring the position recognition data by moving the first moving table, and recognizing the position of the recognition mark set on the substrate by the first camera, and the step of mounting the plurality of electronic components on the substrate includes a step of mounting the electronic component on the substrate by the first mounting head, on the basis of the position calibration data and position recognition data of the first moving table, and a step of mounting the electronic component on the substrate by the second mounting head, on the basis of the same position recognition data as the position calibration data and position recognition data of the second moving table.

The step of acquiring the position calibration data includes:

(1) a step of acquiring the position calibration data for calibrating the position deviation, by mounting a substrate for calibration having a reference mark on the base, and taking the reference mark by at least one camera of the first camera and second camera, and (2) a step of acquiring further position calibration data for correcting position deviation due to temperature changes of the first moving table and second moving table, by taking a position recognition mark set on the base by at least one camera of the first camera and second camera.

In this configuration, in recognition of substrate by the camera conducted prior to the mounting step of electronic components on the substrate by a plurality of mounting heads, the substrate is recognized by one camera only of the plurality of cameras, and the plurality of mounting heads are positioned on the basis of the result of this recognition. Therefore, the substrate recognition time can be shortened.

Referring now to the drawings, exemplary embodiments of the invention are described below.

Figure 2A:
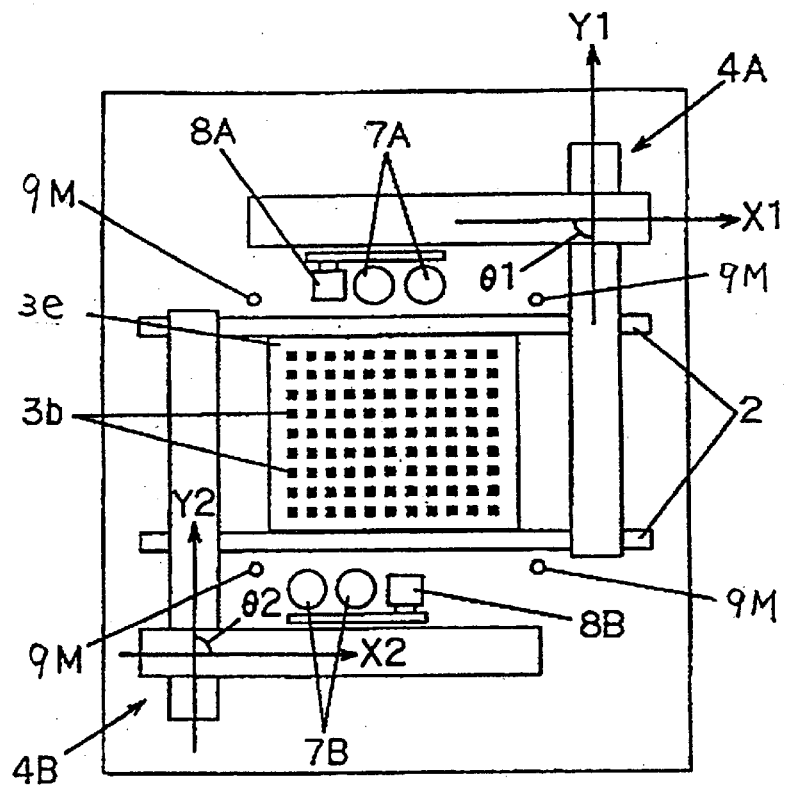
FIG. 2(*a*) is a plan view of an electronic component mounting apparatus in an embodiment of the invention, and FIG. 2(*b*) shows an image diagram for substrate recognition of an electronic component mounting apparatus in an embodiment of the invention.
Figure 2B:
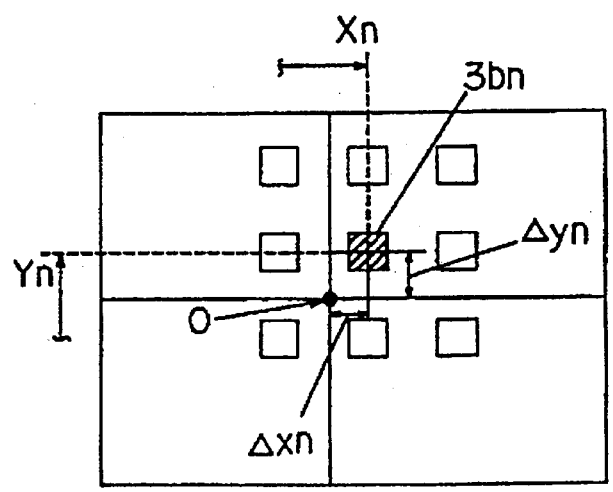
Figure 3:
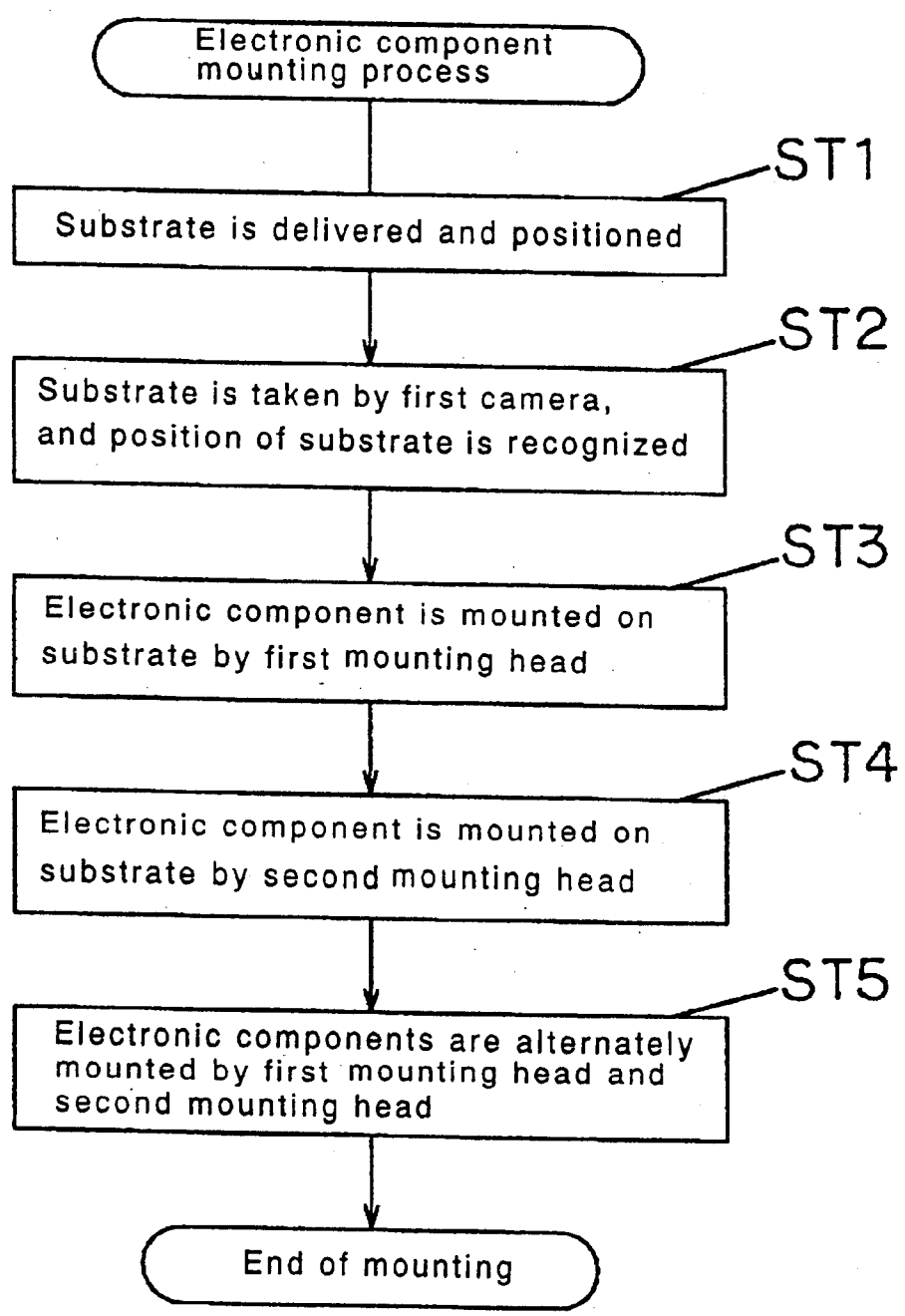
FIG. 3 is a flowchart of electronic component mounting process in an embodiment of the invention.
Figure 4:
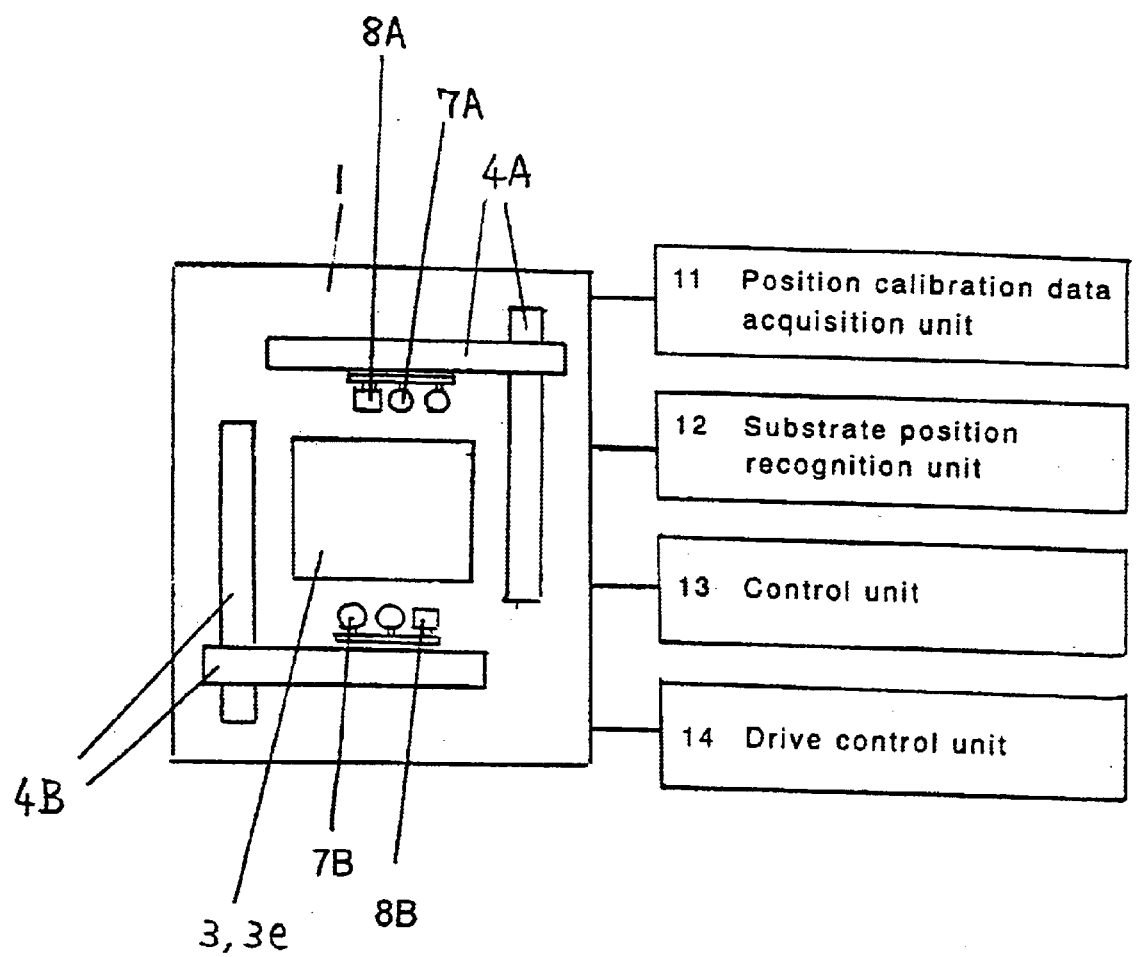
FIG. 4 is a schematic view of an electronic component mounting apparatus in an embodiment of the invention.

FIG. 1 and FIG. 2(a) are plan views of an electronic component mounting apparatus in an exemplary embodiment of the invention. FIG. 2(b) shows an image diagram for substrate recognition of an electronic component mounting apparatus in an exemplary embodiment of the invention. FIG. 3 is a flowchart of electronic component mounting process in an exemplary embodiment of the invention. FIG. 4 is a schematic view of an electronic component mounting apparatus in an exemplary embodiment of the invention.

Referring first to FIG. 1 and FIG. 4, the structure of the electronic component mounting apparatus is explained.

In FIG. 4, the electronic component mounting apparatus comprises a base 1, a first moving table 4A, a second moving table 4B, a position calibration data acquisition unit 11, a substrate position recognition unit 12, a control unit 13, and a drive control unit 14.

The position calibration data acquisition unit 11 recognizes the position of the first moving table 4A and second moving table 4B, and calibrates the position of the first moving table 4A and second moving table 4B. The substrate position recognition unit 12 recognizes the position of a substrate 3 mounted on the base 1. The control unit 13 controls the position of the first moving table 4A and second moving table 4B, on the basis of the substrate position recognition unit 12 and position calibration data acquisition unit 11. The drive control unit 14 drives the first moving table 4A, second moving table 4B, first mounting head 7A and second mounting head 7B.

The first moving table 4A and second moving table 4B are movable on the base 1. The first moving table 4A has a first mounting head 7A and a first camera 8A. The second moving table 4B has a second mounting head 7B and a second camera 8B. The first mounting head 7A and second mounting head 7B have a function of picking up and transferring a plurality of electronic components. The substrate position recognition unit 12 is recognized when taken by the first camera 8A only, The position calibration data acquisition unit 11 has a substrate for calibration 3e set on the base 1. The substrate for calibration 3e has a reference mark 3b (FIG. 2(a)). The first camera 8A and second camera 8B recognizes the reference mark 3b. The position calibration data acquisition unit 11 has a reference position recognition mark 9M (FIG. 2(a))set on the base 1, and a substrate for calibration 3e set on the base 1. The first camera 8A and second camera 8B recognizes the reference mark 3b. At least one camera of the first camera 8A and second camera 8B takes the reference position recognition mark 9M, thereby acquiring further position calibration data for correcting position deviation due to temperature changes of the first moving table 4A and second moving table 4B.

In FIG. 1, a conveying path 2 is disposed on the base 1. The conveying path 2 conveys the substrate 3 delivered from the preceding process, and positions it at the electronic component mounting position. At both sides of the conveying path 2, the first moving table 4A and second moving table 4B are disposed. The first moving table 4A and second moving table 4B have an identical structure.

The first moving table 4A has a first Y-table 5A and a first X-table 6A. The first mounting head 7A is mounted on the first X-table 6A. The second moving table 4B has a second Y-table 5B and a second X-table 6B. The second mounting head 7B is mounted on the second X-table 6B. By driving the first moving table 4A and second moving table 4B, the first mounting head 7A and second mounting head 7B move horizontally, and the first mounting head 7A and second mounting head 7B pick up electronic components from an electronic component feeder (not shown), and transfer and mount them on the substrate 3.

A first camera 8A is mounted on the first X-table 6A. A second camera 8B is mounted on the second X-table 6B. The first camera 8A moves integrally with the first mounting head 7A. The second camera 8B moves integrally with the second mounting head 7B. By driving the first moving table 4A and second moving table 4B, the first camera 8A and second camera 8B are moved on the substrate 3. When the first camera 8A takes the recognition marks 3a provided at diagonal positions of the substrate 3, the position of the substrate 3 is recognized. On the basis of the result of this position recognition, position deviation of the substrate 3 is detected. When mounting electronic components, this position deviation is corrected, and the first moving table 4A and second moving table 4B are driven.

Referring next to FIG. 2(a) and FIG. 2(b), the calibration for correcting the individual positioning errors of the first moving table 4A and second moving table 4B is explained.

As shown in FIG. 2(a), the first moving table 4A has an intrinsic orthogonal coordinate system X1-Y1. The second moving table 4B has an intrinsic system X2-Y2. However, due to mechanical error in coupled state of the first X-table 6A and first Y-table 5A, the intersection angle θ1 of the X-axis and Y-axis is not a complete right angle. Similarly, due to mechanical error in coupled state of the second X-table 6B and second Y-table 5B, the intersection angle θ2 of the X-axis and Y-axis is not a complete right angle. Moreover, the first X-table 6A, second X-table 6B, first Y-table 5A, and second Y-table 5B individually have pitch errors of ball screws or fluctuation in linearity of the guide unit.

Accordingly, the position indicated on the control data and the position of the mounting head actually driven and moved by the moving table do not always coincide with each other precisely. As a result, a position deviation occurs between the mounting position when mounting the electronic components and the mounting point indicated by the data. This position deviation is not constant, and the position deviation differs depending on each position in the moving range of the moving tables. Therefore, when mounting electronic components on a substrate by moving the mounting heads by a plurality of moving tables, a different position deviation occurs at each position on the substrate in each moving table.

To correct these position deviations, calibration is done. In the calibration, a calibration substrate (position calibration substrate) 3e is used. The calibration substrate 3e is manufactured according to the standard so as not to cause positioning error. On the surface of the calibration substrate 3e, as shown in FIG. 2(a), a plurality of reference marks 3b are disposed in a lattice form at specified precision. First, driving the first moving table 4A, the first camera 8A is moved onto the calibration substrate 3e positioned at the specified position. Taking each reference mark 3b sequentially, the position of each reference mark 3b is recognized.

At this time, the move of the first camera 8A is controlled so that the origin O of the optical coordinate system on the control data may coincide with the center of the reference mark 3b. However, as a result of position recognition by the camera, the origin O does not always coincide with the center of the reference mark 3b due to mechanical error of the first moving table 4A. FIG. 2(b) shows the image diagram when the position is recognized by referring to one reference mark 3bn of the plurality of reference marks 3b. Herein, by position recognition, with respect to the reference mark 3bn, the position deviations of Δxn, Δyn from the origin O of the optical coordinate system are detected. The reference mark 3bn is the central coordinates (Xn, Yn) in the machine coordinate system.

That is, when mounting an electronic component near the coordinates (Xn, Yn) in the machine coordinate system, the substrate position recognized by the first camera 8A must be further corrected by Δxn and Δyn. Therefore, upon start of assembling finishing process of the electronic component mounting apparatus, by determining the position deviation amount in all reference marks of the plurality of reference marks 3b, the position calibration data for calibrating the position deviation intrinsic to the coordinate system X1-Y1 of the first moving table 4A may be obtained.

Such calibration is conducted also on the second moving table 4B, in the same manner as in the first moving table 4A, and position calibration data for the second moving table 4B is obtained. That is, driving the second moving table 4B, the second camera 8B is moved onto the calibration substrate 3e positioned at the specified position. Taking each reference mark 3b sequentially, the position of each reference marks 3b is recognized. Then, by the same manner as above, the position calibration data of the second moving table 4B is obtained.

Herein, the reference position incorporation in the initial state conducted simultaneously with the calibration is described. In FIG. 2(a), at the fixed position on the base 1, the reference position recognition mark 9M as the reference position is set. That is, four reference position recognition marks 9M are disposed at specified positions on the base 1. These reference position recognition marks 9M have the function of calibrating the time-course changes of the position deviation state due to thermal distortion by temperature changes after start of operation of the mounting apparatus.

These reference position recognition marks 9M are recognized by the camera of the moving table at the time of calibration of each moving table, and the result of recognition is stored as the reference position. After start of operation, by a specified interval, the position of these reference position recognition marks 9M is recognized again. The obtained result of position recognition is compared with the stored reference position. As a result, the change of the position deviation state due to time-course changes after operation is detected. That is, the intersection angles θ1, θ2 shown in FIG. 2(a), and the displacement state due to thermal distortion of the mechanical parts can be detected. By adding this detection result to the position calibration data by calibration, the change of position deviation state due to time-course change can be corrected on every occasion.

The mounting process of a plurality of electronic components is described below by referring to the flowchart in FIG. 3.

(1) Step ST1: First, the substrate 3 is delivered from the preceding step, and is positioned at the electronic component mounting position on the conveying path 2.

(2) Step ST2: Next, the first moving table 4A is driven, and the first camera 8A is positioned on the recognition marks 3a of the substrate 3. The first camera 8A recognizes the position of recognition marks 3a sequentially. As a result, the position of the substrate 3 is recognized.

(3) Step ST3: In succession, the first moving table 4A is driven, and the first mounting head 7A is moved to the feeder (not shown). At the feeder, the first mounting head 7A picks up an electronic component. Then the mounting head 7A is moved onto the substrate 3, and the electronic component is mounted on the substrate 3. In this mounting operation, the first moving table 4A is driven on the basis of the position recognition result of the substrate 3 at step ST2 and the position calibration data intrinsic to the first moving table 4A determined in the calibration.

(4) Step ST4: Later, by the second mounting head 4B, an electronic component is mounted on the substrate 3. At this time, the position of the substrate 3 is not recognized. By using the position recognition result determined by taking by the first camera 8A at step ST2 and the position calibration data intrinsic to the second moving table 4B, similarly, driving of the second moving table 4B is corrected. Thus, the substrate position recognition of each moving table required in the prior art for mounting electronic components by using a plurality of moving tables can be omitted, and, as a result, the total mounting time can be shortened.

(5) Step ST5: Then, by the first mounting head 7A and second mounting head 7B, a specified number of electronic components are mounted on the substrate 3. The plurality of electronic components are mounted on a same substrate simultaneously by parallel operation.

(6) Thus, the mounting process of plurality of electronic components is completed.

In this way, when mounting a plurality of electronic components by a plurality of moving tables, the position deviation in mounting is corrected on the basis of the position recognition result determined by taking by only one camera of the plurality of cameras. As a result, the mounting time is shortened, and the productivity is enhanced.

According to the invention, in the substrate recognition by the camera conducted prior to mounting of electronic components on the substrate by means of a plurality of mounting heads, the substrate is recognized by only one camera of the plurality of cameras, and the plurality of mounting heads are positioned on the basis of this recognition result. Therefore, the substrate recognition time is shortened, the cycle time is shortened, and the productivity is enhanced.

What is claimed is:

1. An electronic component mounting method comprising the steps of:

(a) preparing a base, and a first moving table and a second moving table installed on said base,
wherein said first moving table and said second moving table are movable on said base,
said first moving table has a first mounting head and a first camera,
said second moving table has a second mounting head and a second camera, and
said first mounting head and said second mounting head pick up and transfer a plurality of electronic components, (b) acquiring position calibration data intrinsic to each moving table of said first moving table and said second moving table based on reference marks on a calibration substrate and based on reference position recognition mark on said base, (c) conveying a substrate onto said base, (d) recognizing a position of said substrate by at least one camera or said first camera and said second camera, and acquiring position recognition data, (e) controlling a position of said first moving table and said second moving table on the basis of said position calibration data and said position recognition data, and (f) picking up said plurality of electronic components by said first mounting head and said second mounting head, and mounting on said substrate.

2. The electronic component mounting method of claim 1, wherein said step of acquiring said position recognition data is a step of recognizing the position of said substrate by only one camera of said first camera and second camera.

3. The electronic component mounting method of claim 1, wherein said step of acquiring said position calibration data includes the steps of:

(1) mounting said calibration substrate having reference marks onto said base, and (2) taking said reference marks by at least one camera of said first camera and said second camera, and acquiring said position calibration data for calibrating a position deviation.

4. The electronic component mounting method of claim 3, wherein said reference mark has a plurality of reference marks, and
said step of acquiring said position calibration data includes a step of taking all of said plurality of reference marks by said first camera, and recognizing the position deviation of each reference mark of the plurality of reference marks.

5. The electronic component mounting method of claim 1, wherein said step of acquiring said position recognition data includes a step of moving said first moving table, and recognizing a position of the recognition mark set on said substrate by said first camera.

6. The electronic component mounting method of claim 5, wherein said recognition mark has a plurality of recognition marks, and
said first camera recognizes each recognition mark of said plurality of recognition marks sequentially.

7. The electronic component mounting method of claim 1, wherein said step of acquiring said position recognition data includes a step of acquiring said position recognition data by moving said first moving table, and recognizing the position of the recognition mark set on said substrate by said first camera, and said step of mounting said plurality of electronic components on the substrate includes a step of mounting the electronic component on the substrate by said first mounting head, on the basis of said position calibration data and said position recognition data of the first moving table, and a step of mounting the electronic component on the substrate by said second mounting head, on the basis of the same position recognition data as the position calibration data and said position recognition data of said second moving table.

8. The electronic component mounting method of claim 1, wherein said step of acquiring said position calibration data includes the steps of:

(1) acquiring said position calibration data for calibrating the position deviation, by mounting a calibration substrate having a reference mark on said base, and taking said reference mark by at least one camera of said first camera and said second camera, and (2) acquiring a further position calibration data for correcting position deviation due to temperature changes of said first moving table and second moving table, by taking a reference position recognition mark set on said base by at least one camera of said first camera and second camera.

9. The electronic component mounting method of claim 1, wherein said first moving table is movable in the X-axis and Y-axis direction, and said second table is movable in said X-axis and Y-axis direction.

10. An electronic component mounting method for mounting a plurality of electronic components on a substrate by using a plurality of moving tables, said plurality of moving tables installed on a base, each moving table of said plurality of moving tables including a mounting head for picking up and transferring each electronic component; and a camera for recognizing said substrate, said mounting method comprising the steps of:
(a) taking an image of a calibration substrate having a reference mark for position calibration by said camera, and obtaining position calibration data intrinsic to said each one of moving tables having the camera,
(b) taking an image of a said substrate by only one of said cameras prior to mounting of said each one of electronic components, and recognizing a position of said substrate, and
(c) picking up said each one of electronic components by said each one of mounting heads, and mounting the electronic component on said substrate, wherein said step of mounting each electronic component on the substrate induces a step of controlling the position of said moving table on the basis of said substrate position recognition result and said position calibration data, said position calibration data based on said calibration substrate having said reference mark and based on reference position recognition mark on said base.

11. An electronic component mounting apparatus comprising:
(a) a base,
(b) a first moving table and a second moving table installed on said base,
  wherein said first moving table and second moving table are movable on said base,
  said first moving table has a first mounting head and a first camera,
  said second moving table has a second mounting head and a second camera, and
  said first mounting head and said second mounting head have a function of picking up and transferring a plurality of electronic components,
(c) a position calibration data acquisition unit for recognizing a position of said first moving table and said second moving table, and calibrating a position of said first moving table and said second moving table based on reference marks on a calibration substrate and based on reference position recognition mark on said base,
(d) a position recognition unit for recognizing the position of a substrate mounted on said base,
  wherein said position recognition unit is recognized when taken by said first camera only,
(e) a control unit for controlling the position of said first moving table and said second moving table on the basis of said position recognition unit and said position calibration data acquisition unit, and
(f) a drive control unit for driving said first moving table, said second moving table, said first mounting head and said second mounting head.

12. The electronic component mounting apparatus of claim 11,
wherein said position calibration data acquisition unit has a calibration substrate to be mounted on said base,
said calibration substrate has a reference mark, and
said first camera and said second camera recognize said reference mark.

13. The electronic component mounting apparatus of claim 11,
wherein said position calibration data acquisition unit has a reference position recognition mark set on said base, and a calibration substrate to be mounted on the base,
said calibration substrate has a reference mark,
said first camera and said second camera recognize said reference mark, and
at least one camera of said first camera and second camera takes said reference position recognition mark, thereby obtaining a further position calibration data for correcting the position deviation due to temperature changes of said first moving table and said second moving table.

* * * * *

UNITED STATES PATENT AND TRADEMARK OFFICE
CERTIFICATE OF CORRECTION

PATENT NO. : 6,647,138 B1  Page 1 of 1
DATED : November 11, 2003
INVENTOR(S) : Sakaguchi It is certified that error appears in the above-identified patent and that said Letters Patent is hereby corrected as shown below:

<u>Column 9,</u>
Line 57, "induces" should read -- includes --.

Signed and Sealed this

Eighth Day of June, 2004

JON W. DUDAS
*Acting Director of the United States Patent and Trademark Office*